(12) United States Patent
Morita

(10) Patent No.: US 8,264,291 B2
(45) Date of Patent: Sep. 11, 2012

(54) RESONATOR AND A METHOD OF MANUFACTURING THE SAME, AND OSCILLATOR AND ELECTRONIC APPARATUS INCLUDING THE SAME

(75) Inventor: Shinya Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 1 day.

(21) Appl. No.: 12/794,318

(22) Filed: Jun. 4, 2010

(65) Prior Publication Data

US 2010/0321125 A1  Dec. 23, 2010

(30) Foreign Application Priority Data

Jun. 19, 2009  (JP) .................. 2009-146650

(51) Int. Cl.
   *H03B 5/30* (2006.01)
   *H03H 9/15* (2006.01)
(52) U.S. Cl. ............... 331/154; 331/116 M; 333/188; 333/191; 333/192; 333/197
(58) Field of Classification Search ............... 331/50, 331/56, 107 DP, 116 M, 116 R, 154, 156; 333/186–193, 197
   See application file for complete search history.

(56) References Cited

U.S. PATENT DOCUMENTS

| | | | | |
|---|---|---|---|---|
| 3,581,232 A | * | 5/1971 | Murayama et al. | 331/107 DP |
| 4,291,279 A | * | 9/1981 | Buck | 330/287 |
| 7,453,332 B2 | * | 11/2008 | Nakamura | 333/186 |
| 7,755,454 B2 | * | 7/2010 | Tanaka et al. | 333/186 |
| 7,990,233 B2 | * | 8/2011 | Suzuki | 333/186 |
| 2007/0216496 A1 | * | 9/2007 | Nakanishi et al. | 333/186 |

OTHER PUBLICATIONS

Dana Weinstein and Sunil A. Bhave; Internal Dielectric Transduction of a 4.5 GHz Silicon Bar Resonator; IEEE International Electron Device Meeting; 2007; pp. 415-418.

* cited by examiner

*Primary Examiner* — Levi Gannon
(74) *Attorney, Agent, or Firm* — SNR Denton US LLP

(57) ABSTRACT

Disclosed herein is a resonator including, a vibrating portion having a conductor portion, and three or more insulating portions provided so as to electrically separate the conductor portion into a plurality of blocks, wherein when a potential difference is caused across both ends in each of the three or more insulating portions, the vibrating portion carries out a resonance vibration based on a longitudinal vibration in accordance with a frequency of an A.C. signal inputted to each of corresponding ones of the plurality of blocks in the conductor portion.

20 Claims, 11 Drawing Sheets

RESONATOR AND A METHOD OF MANUFACTURING THE SAME, AND OSCILLATOR AND ELECTRONIC APPARATUS INCLUDING THE SAME

BACKGROUND OF THE INVENTION

1. Field of the Invention

The present invention relates to a resonator to which an element technology of Micro Electro Mechanical Systems (MEMS) is applied and a method of manufacturing the same, and an oscillator and an electronic apparatus each including such a resonator.

2. Description of the Related Art

Along with a recent progress in a wireless communication technology, miniaturization and a reduction in weight are both required for a communication apparatus utilizing the wireless communication technology. For this reason, a Micro Electro Mechanical Systems (MEMS) technology for making a fine mechanical construction by using a fine pattern technology in a semiconductor field has been utilized in an RF signal processing portion or the like which has been difficult to miniaturize up to this day. The MEMS is a system in which a micro mechanical element and an electronic circuit are fused with each other by using the silicon process technology, and is mainly referred to as a micro machine in Japan. The MEMS technology can realize a minute and inexpensive System on Chip (SoC) while coping with the high functionality from the superior features such as the precise machining property thereof.

SUMMARY OF THE INVENTION

A mechanical resonator (MEMS resonator) utilizing a mechanical resonance is known as one of elements each using such an MEMS technology. RF elements such as a filter, an oscillator and a mixer start to be applied to the communication field because they are minute and thus can be integrated with one another. However, along with the high frequency promotion in the applications such as a mobile phone and a millimeter-wave communication, the promotion of the high frequency of GHz or more in an operating frequency is required for such an MEMS resonator as well.

Then, for the purpose of realizing the high frequency promotion in the operating frequency, there is proposed a dielectric embedded MEMS resonator utilizing a longitudinal wave vibration. This dielectric embedded MEMS resonator, for example, is described in a Non-Patent Document of Dana Weinstein and Sunil A. Bhave, "Internal Dielectric Transduction of a 4.5 GHz Silicon Bar Resonator," IEEE International Electron Device Meeting 2007, pp. 415 to 418. In this dielectric embedded MEMS resonator, a dielectric film (insulating film) for obtaining an electrostatic driving force is embedded in a vibrator in order to generate a longitudinal wave vibration, thereby realizing an operation in a high frequency region of GHz or more.

FIGS. 9 and 10 respectively show a schematic construction, and the principles of an operation of a dielectric embedded MEMS resonator (a resonator 100-1). FIG. 9 shows a perspective construction of an exterior appearance of the dielectric embedded MEMS resonator, and FIG. 10 shows a construction of the dielectric embedded MEMS resonator when viewed from an X-Y plane (upper surface). In the resonator 100-1, a rectangular parallelepiped (extending in an X-axis direction)-like vibrating portion 101 is provided on a supporting substrate 100 through a gap G. The rectangular parallelepiped-like vibrating portion 101 is composed of a conductor portion 101A made of a conductor material Si or the like, and two insulating films 101B each made of a silicon nitride (SiN). The conductor portion 101A is electrically separated into three blocks along a transmission direction (an X-axis direction) of an A.C. (Alternating Current) signal. Both side surfaces (a Z-X side surfaces) of each of the three blocks are supported to a substrate surface by beam portions 102 (supporting beams), and supporting portions 103 (anchors). Also, an input A.C. signal Sin is inputted from an input signal line Lin to which a capacitor C1 is connected to the block on one end side of the three blocks through corresponding one of the supporting portions 103 and corresponding one of the beam portions 102 in the block on one end side. On the other hand, an output A.C. signal is outputted from an output signal line Lout through corresponding one of the beam portions 102 and corresponding one of the supporting portions 103 in the block on the other end side. In addition, a D.C. voltage Vdc for giving a potential difference (bias) across the both end surfaces (Y-Z end surfaces) in each of the insulating films 101B is supplied to the middle block through a coil L1.

When in this state, the input A.C. signal Sin having an arbitrary frequency is inputted from the input signal line Lin to the supporting portion 103 and the beam portion 102 in the block on one end side of the three blocks, an electrostatic attractive force having the arbitrary frequency is generated in each of the insulating films 101B. As a result, a compressive stress acts on the inside of the vibrating portion 101. Here, when the arbitrary frequency of the input A.C. signal Sin is equal to a resonance frequency of a longitudinal wave vibration depending on a size of the resonator, the vibrating portion 101 causes a resonance vibration based on the longitudinal wave vibration. This resonance vibration is represented by a waveform W01 in FIG. 10. Then, the compression and the expansion are repetitively carried out in each of the insulating films 101B by the vibration. A potential difference is generated across the both end surfaces (Y-Z end surfaces) of each of the insulating films 101B by such a deformation (indicated by a two-headed arrow P101 in FIG. 10) of the insulating film 101B. Therefore, the output A.C. signal Sout having the frequency equal to the resonance frequency is outputted from the output signal line Lout through the beam portion 102 and the supporting portion 103 in the block on the other end side. The resonator 100-1 functions as a resonator for selectively transmitting only a signal having a certain frequency (resonance frequency) of the arbitrary input A.C. signal Sin in accordance with such principles of the operation.

However, since such an existing dielectric embedded MEMS resonator has a high impedance, the impedance has been required to be reduced in order to realize the practical use.

The present invention has been made in the light of such a problem, and it is therefore desirable to provide a resonator in which an impedance can be further reduced as compared with the case of the existing resonator and a method of manufacturing the same, and an oscillator and an electronic apparatus each including the same.

In order to attain the desire described above, according to an embodiment of the present invention, there is provided a resonator including: a vibrating portion having a conductor portion, and three or more insulating portions provided so as to electrically separate the conductor portion into a plurality of blocks; in which when a potential difference is caused across both ends in each of the three or more insulating portions, the vibrating portion carries out a resonance vibration based on a longitudinal vibration in accordance with a frequency of an A.C. signal inputted to each of corresponding ones of the plurality of blocks in the conductor portion.

According to another embodiment of the present invention, there is provided an oscillator including: a resonator for carrying out a resonance vibration; the resonator including: a vibrating portion having a conductor portion, and three or more insulating portions provided so as to electrically separate the conductor portion into a plurality of blocks; in which when a potential difference is caused across both ends in each of the three or more insulating portions, the vibrating portion carries out a resonance vibration based on a longitudinal vibration in accordance with a frequency of an A.C. signal inputted to each of corresponding ones of the plurality of blocks in the conductor portion.

According to still another embodiment of the present invention, there is provided an electronic apparatus including: a resonator for carrying out a resonance vibration; the resonator including: a vibrating portion having a conductor portion, and three or more insulating portions provided so as to electrically separate the conductor portion into a plurality of blocks; in which when a potential difference is caused across both ends in each of the three or more insulating portions, the vibrating portion carries out a resonance vibration based on a longitudinal vibration in accordance with a frequency of an A.C. signal inputted to each of corresponding ones of the plurality of blocks in the conductor portion.

In each of the resonator, the oscillator and the electronic apparatus, when the potential difference is caused across the both ends in each of the three or more insulating films within the vibrating portion, the vibrating portion carries out the resonance vibration based on the longitudinal vibration in accordance with the frequency of the A.C. signal inputted to each of the corresponding ones of the plurality of blocks in the conductor portion. As a result, an A.C. signal is outputted from each of corresponding ones of the plurality of blocks in the conductor portion. At this time, since the three or more insulating portions are provided in the vibrating portion, an area (an area of the end surfaces) of the three or more insulating portions in the vibrating portion becomes larger than that in the existing resonator.

According to yet another embodiment of the present invention, there is provided a method of manufacturing a resonator including the step of: forming a vibrating portion having a conductor portion, and three or more insulating portions for electrically separating the conductor portion into a plurality of blocks, and carrying out a resonance vibration based on a longitudinal vibration in accordance with a frequency of an A.C. signal inputted to each of corresponding ones of the plurality of blocks in the conductor portion when a potential difference is caused across both ends in each of the three or more insulating portions on a substrate.

In the method of manufacturing a resonator, since the three or more insulating portions are provided in the vibrating portion in the step described above, an area (an area of the end surfaces) of the three or more insulating portions in the vibrating portion becomes larger than that in the existing resonator.

As set forth hereinabove, according to the resonator and the method of manufacturing the same, and the oscillator and the electronic apparatus each including the same, the three or more insulating portions are provided within the vibrating portion for carrying out the resonance vibration based on the longitudinal vibration in accordance with the frequency of the A.C. signal inputted. Therefore, the area (the area of the end surfaces) of the three or more insulating portions in the vibrating portion can be made large, and thus the impedance can be reduced as compared with the case of the existing resonator.

DETAILED DESCRIPTION OF THE PREFERRED EMBODIMENTS

The preferred embodiments of the present invention will be described in detail hereinafter with reference to the accompanying drawings. It is noted that the description will be given below in accordance with the following order.

Figure 1:
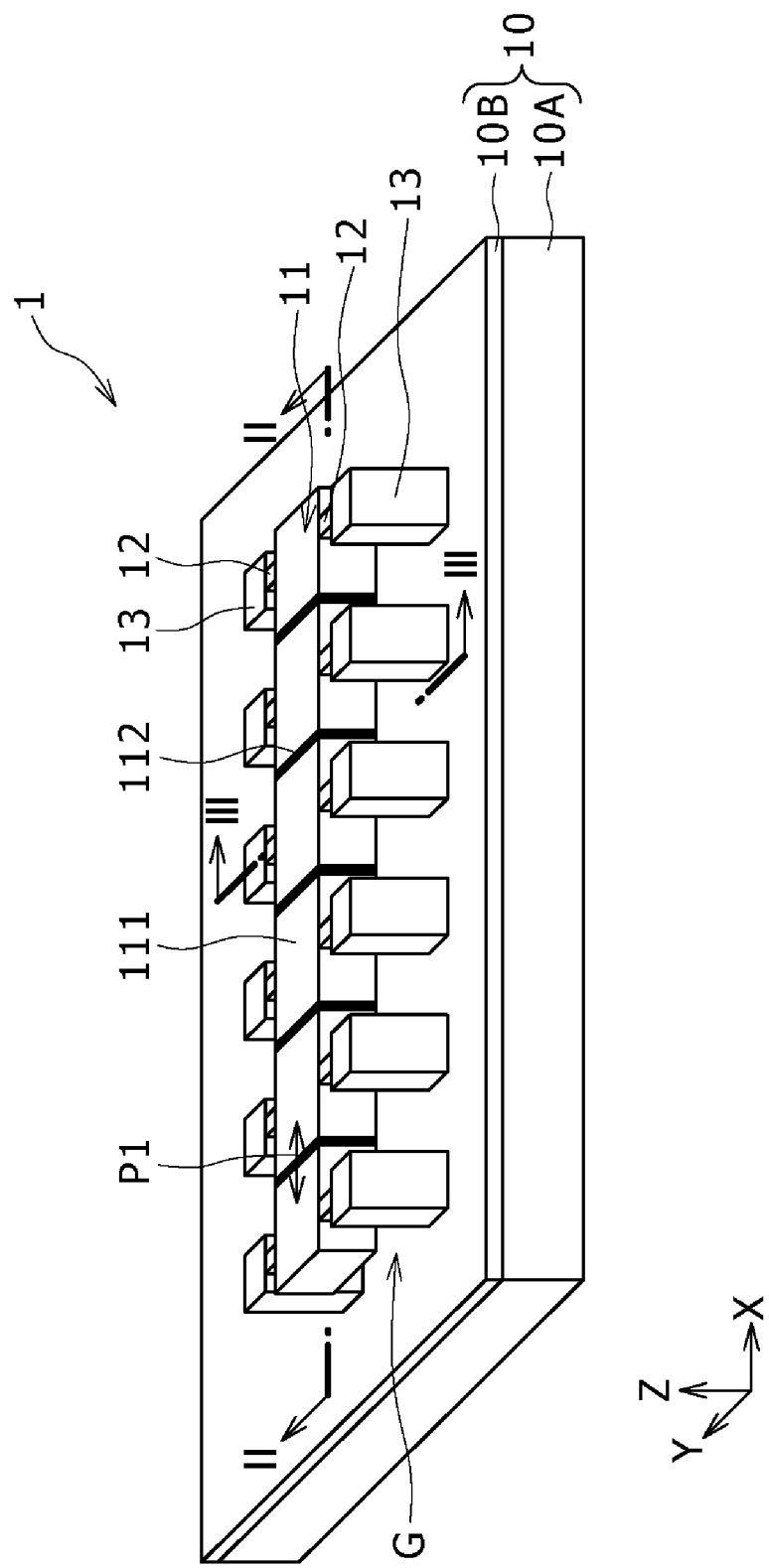
FIG. 1 is a perspective view showing a construction of an exterior appearance of a resonator according to an embodiment of the present invention.
Figure 2:
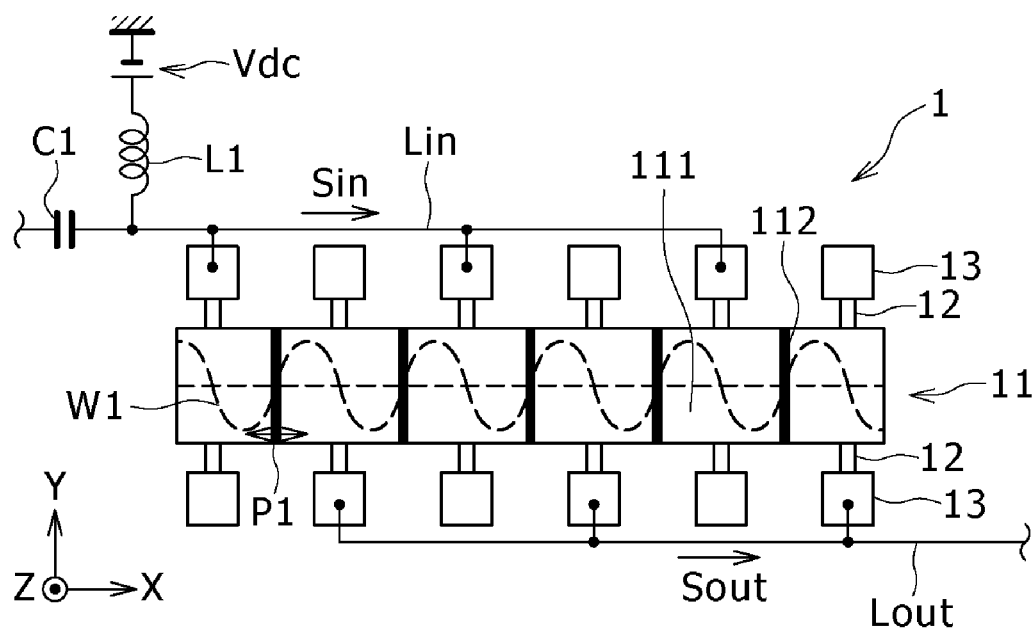
FIG. 2 is a top plan view schematically showing a construction and the principles of an operation of the resonator shown in FIG. 1.

1. Resonator (a resonator having three or more insulating films provided within a vibrating portion)
2. Method of Manufacturing Resonator
3. Changes
  Change 1 (a resonator in which an input signal line, an output signal line and a voltage supply line are provided separately from one another)
  Change 2 (a resonator which vibrates along two directions making at a right angle with each other within a vibration surface)
  Change 3 (a resonator in which insulating films are disposed concentrically and which vibrates radially from a center)
  Change 4 (a resonator in which a vibrating portion has an annular shape, and insulating films are disposed along an annular direction)
4. Oscillator (an oscillator having the resonator built-in)
5. Electronic Apparatus (an electronic apparatus having the resonator built-in)
1. Resonator
[Construction of Resonator]
FIG. 1 shows a construction of an exterior appearance of a resonator 1 according to an embodiment of the present invention in a perspective fashion. FIG. 2 schematically shows a construction when viewed from an upper surface (a construction when viewed from an X-Y plane) of the resonator 1 shown in FIG. 1. The resonator 1 is an MEMS resonator which transmits an A.C. signal having a high frequency (for example, about 60 GHz) by utilizing a resonance vibration based on a mechanical longitudinal wave vibration in a vibrating portion 11, extending in an X-axis direction, which will be described below.

In the MEMS resonator 1, a rectangular parallelepiped-like vibrating portion 11 is provided on a supporting substrate 10 through a gap G. The vibrating portion 11 is composed of a conductor portion 111 and three or more insulating films (five insulating films in this case)(insulating portions) 112. The conductor portion 111 is electrically separated into six blocks along a transmission direction (along an X-axis direction) of an A.C. signal by the five insulating films 112. Both side surfaces (Z-X side surfaces) of each of the six blocks are supported to a substrate surface by beam portions 12 (supporting beams) and supporting portions 13 (anchors).

The supporting substrate 10 is composed of a Si substrate 10A and a protective layer 10B laminated on the Si substrate 10A. The protective layer 10B is formed in order to protect the base (the Si substrate 10A) when a sacrificing layer 20 which will be described later is removed by utilizing a wet etching method in a phase of manufacture. The protective layer 10B, for example, is made of an insulating material such as SiN. Therefore, the protective layer 10B has such a thickness (of, for example, about 200 nm) as to be able to withstand the wet etching.

The vibrating portion 11 has a rectangular parallelepiped-like shape having a size in which, for example, a length in an X-axis direction is about 40 µm, a length in a Y-axis direction is about 10 µm, and a length in a Z-axis direction is about 2 µm. In the vibrating portion 11, the conductor portion 111 is made of conductive Si such as polycrystalline Si (p-Si), for example, containing therein phosphorus (P) to show a conductive property. However, there may also be used any other suitable conductive material such as a metal (such as aluminum (Al) or titanium (Ti)) or a semiconductor (such as Si or germanium (Ge)), or a nitride thereof (such as a titanium nitride (TiN)) or a carbide thereof (such as a titanium carbide (TiC)). It is noted that each of the beam portion 12 and supporting portion 13 described above is also made of the same material as that of the conductor portion 111. On the other hand, the insulating film 112, for example, is made of an insulating material such as SiN, and a thickness thereof, for example, is set at 30 nm. Here, a silicon oxide ($SiO_2$), a titanium oxide ($TiO_2$), an oxide or nitride of polyimide, BCB or the like, an organic material or the like can be given as an insulating material other than SiN. It should be noted that as can be seen from Expression (1) which will be expressed later, since an electromechanical conversion efficiency is increased to further reduce an impedance of the resonator 1 with an increase in electric permittivity, $\in$, of the insulating film 12, a material having a large electric permittivity, $\in$, is preferably used for the insulating film 12.

The six blocks in the vibrating portion 11 consists of the three input blocks to each of which an input A.C. signal Sin is inputted, and three output blocks from each of which an output A.C. signal Sout is outputted. In each of the three input blocks, the input A.C. signal Sin is inputted from an input signal line Lin to which a capacitor C1 is connected through the corresponding one of the supporting portions 13, and corresponding one of the beam portions 12. On the other hand, in each of the three output blocks, the output A.C. signal is outputted from the output signal line Lout through the corresponding one of the beam portions 12, and the corresponding one of the supporting portions 13. That is to say, as shown in FIG. 2, the three input blocks and the three output blocks are alternately disposed along a transmission direction (along the X-axis direction) of the A.C. signal. In addition, a D.C. voltage Vdc for giving a potential difference (bias) across both end surfaces (Y-Z end surfaces) in each of the insulating films 112 is supplied to each of the three input blocks through the coil L1, the input signal line Lin, the corresponding one of the beam portions 12, and the corresponding one of the supporting portions 13. That is to say, although in this case, the D.C. voltage Vdc is supplied to the input block side, for example, the D.C. voltage Vdc may be supplied to the output block side.

Although details will be described later, when the potential difference (corresponding to the D.C. voltage Vdc described above) is caused across the both end surfaces (the Y-Z end surfaces) in each of the insulating films 112, the vibrating portion 11 carries out the resonance vibration based on the longitudinal wave vibration in accordance with the frequency of the input A.C. signal Sin. The resonance vibration based on the longitudinal wave vibration is represented in the form of a waveform W1 in FIG. 2. Also, the six blocks in the conductor portion 111 and the five insulating films 112 are disposed along predetermined one direction (along the X-axis direction in this case indicated by a two-headed arrow P1 in FIGS. 1 and 2) so that each of the five insulating films 112 vibrates along the predetermined one direction (along the X-axis direction). Here, each of the five insulating films 112, as shown in FIG. 2, is preferably disposed either in a position corresponding to at least one of node portions of the waveform W1 in the longitudinal wave vibration or in the vicinity of the at least one of node portions of the waveform W1 in the longitudinal wave vibration. The reason for this is because each of the insulating films 112 is disposed in such a position, thereby realizing the more effective resonance vibration. In addition, similarly, as shown in FIG. 2, each of the beam portion 12 and the supporting portion 13 is also preferably disposed either in the position corresponding to at least one of node portions of the waveform W1 in the longitudinal wave vibration or in the vicinity of the at least one of node portions of the waveform W1 in the longitudinal wave vibration. The reason for this is because each of the beam portions 12, and each of the supporting portions 13 are disposed in such a position, thereby avoiding that the vibration of the vibrating portion 11 is impeded. It is noted that although in the MEMS resonator 1 of the embodiment, the vibrating portion 11 is supported from the side surface side thereof by using the beam portions 12, the vibrating portion 11 may also be supported from any other suitable direction such as the lower side (the substrate surface side) of the vibrating portion 11.

2. Method of Manufacturing Resonator

An embodiment of a method of manufacturing the resonator 1 according to the embodiment of the present invention will be described in detail hereinafter with reference to FIGS. 3A to 3K. FIGS. 3A to 3K are respectively cross sectional views showing respective processes for manufacturing the resonator 1. In FIG. 3A to 3K, left-hand side parts are respectively cross sectional views (Z-X cross sectional views) each taken on line II-II of FIG. 1, and right-hand side parts are respectively cross sectional views (Y-Z cross sectional views) each taken on line III-III of FIG. 1.

Figure 3A:
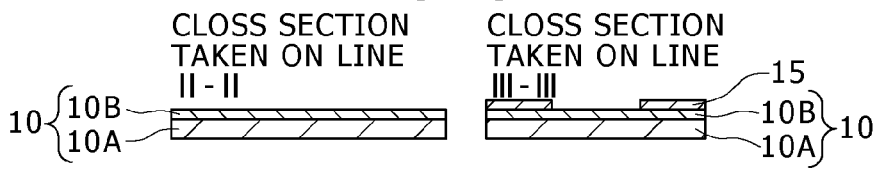
FIGS. 3A to 3K are respectively cross sectional views showing respective processes for manufacturing the resonator shown in FIG. 1.

Firstly, as shown in FIG. 3A, the protective layer 10B made of the insulating material such as SiN is uniformly formed on the Si substrate 10A so as to have a thickness of, for example, about 500 nm by, for example, utilizing a low pressure Chemical Vapor Deposition (CVD) method. As a result, the supporting substrate 10 is formed so as to be composed of the Si substrate 10A and the protective layer 10B. Next, a p-Si layer 15 made of polycrystalline Si is uniformly formed on the supporting substrate 10 so as to have a thickness of, for example, about 1,000 nm by, for example, utilizing the low pressure CVD method. After that, the p-Si layer 15 is patterned by, for example, utilizing a dry etching method using a photolithography process. The p-Si layer 15 thus patterned becomes the wiring portions such as the input signal line Lin, and the output signal line Lout.

Figure 3B:
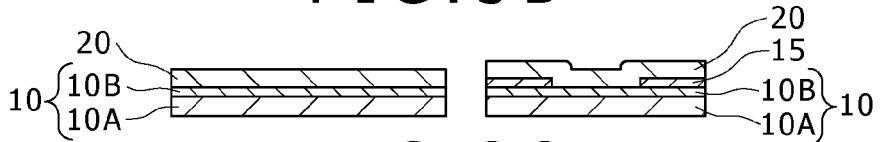
Figure 3C:
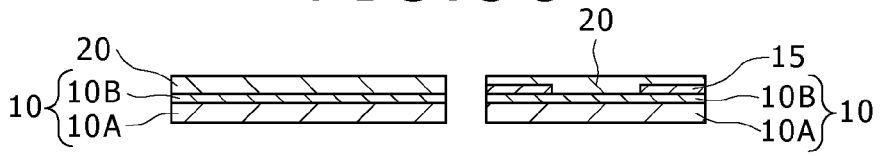

Subsequently, as shown in FIG. 3B, a silicon oxide ($SiO_2$) layer is uniformly formed on the supporting substrate 10 and the p-Si layer 15 so as to have a thickness of, for example, about 500 nm by, for example, utilizing the low pressure CVD method, thereby forming a sacrificing layer 20. After that, as shown in FIG. 3C, a surface of the sacrificing layer 20 is planarized by, for example, utilizing a Chemical Mechanical Polishing (CMP) method.

Figure 3D:
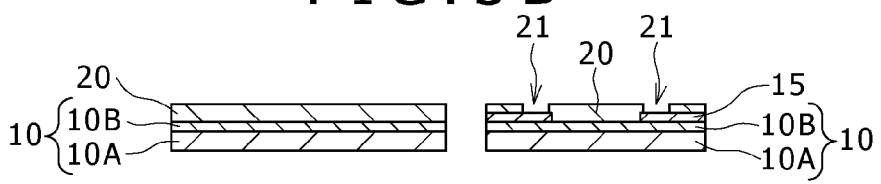

Next, as shown in FIG. 3D, dry etching using the photolithography process, for example, is carried out for the surface of the sacrificing layer 20 thus planarized, thereby forming an opening (contact hole), for formation of the supporting portion 13, in the sacrificing layer 20. A size of the opening 21 is set as, for example, about 5 μm×about 5 μm, and a depth of the opening 21 is set as, for example, about 400 nm.

Figure 3E:
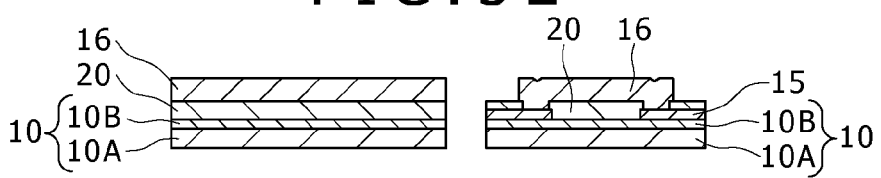
Figure 3F:
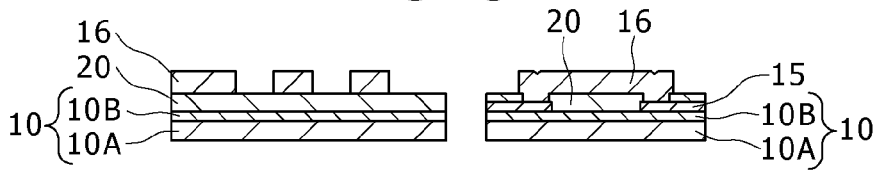

Subsequently, as shown in FIG. 3E, a p-Si layer 16 made of polycrystalline Si, for formation of the conductor portion 111 in the vibrating portion 11 is uniformly formed on the sacrificing layer 20 having the opening formed therein so as to have a thickness of, for example, about 2,000 nm by, for example, utilizing the low pressure CVD method. After that, the p-Si layer 16 is patterned by, for example, utilizing the dry etching method using the photolithography process. As a result, as shown in FIG. 3F, a conductor pattern layer having a plurality of conductor patterns (three conductor patterns in this case) disposed separately from one another is formed on the sacrificing layer 20.

Figure 3G:
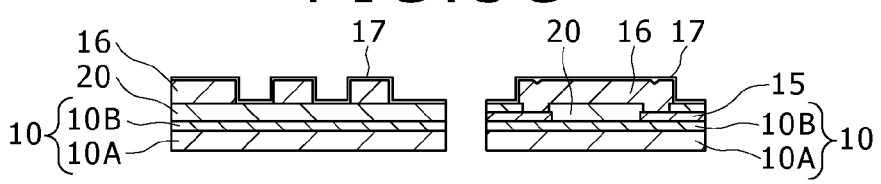

Next, as shown in FIG. 3G, an insulating layer 17 made of SiN or the like is uniformly formed on the sacrificing layer 20, and on surfaces and side surfaces of the three conductor patterns so as to have a thickness of, for example, about 30 nm by, for example, utilizing the low pressure CVD method.

Figure 3H:
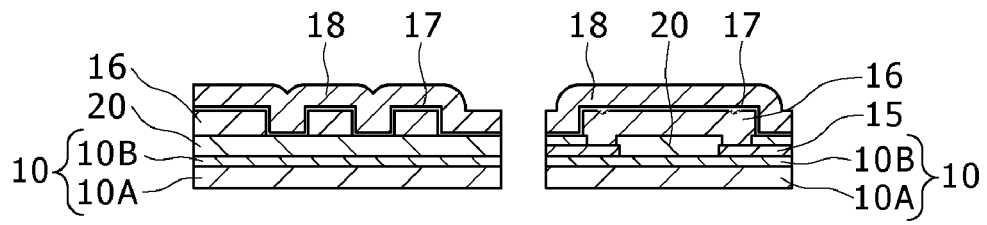
Figure 3I:
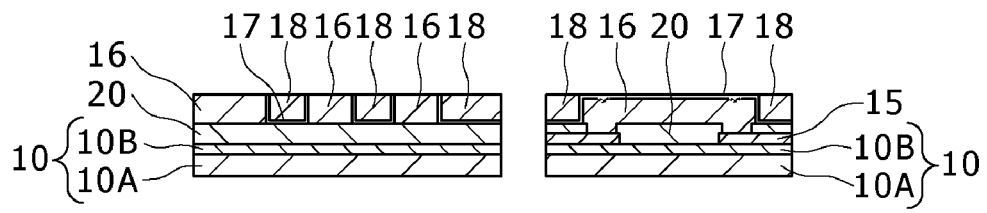

Subsequently, as shown in FIG. 3H, a p-Si layer (conductor layer) 18 made of polycrystalline Si is uniformly formed again on the insulating layer 17 so as to have a thickness of, for example, about 2,000 nm. After that, as shown in FIG. 3I, the surfaces of the p-Si layer (conductor pattern layer) 16, the insulating layer 17 and the p-Si layer 18 are planarized by, for example, utilizing the CMP method. As a result, there is obtained a shape in which the insulating layer 17 becoming the insulating film 112 is embedded between each adjacent two p-Si layers 16 and 18 each becoming the block of the conductor portion 111.

Figure 3J:
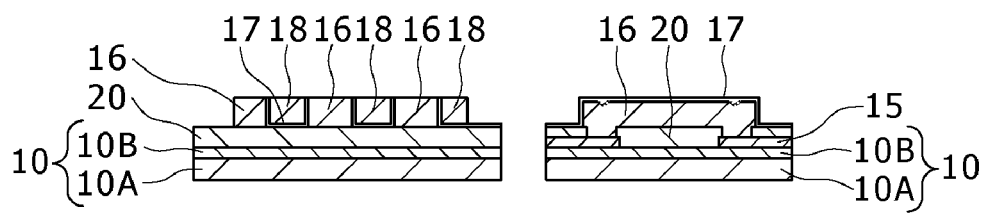

Next, as shown in FIG. 3J, each adjacent two p-Si layers 16 and 18 having the insulating layer embedded between them are patterned by, for example, utilizing the dry etching method using the photolithography process. As a result, an outer shape of the vibrating portion 11 is formed together with the beam portions 12 and the supporting portions 13.

Figure 3K:
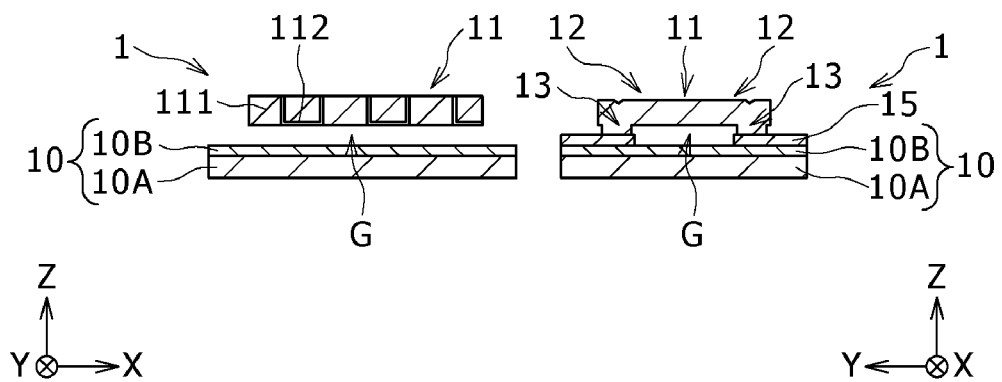

Subsequently, as shown in FIG. 3K, a wet etching method using an etchant such as a diluted hydrofluoric acid (DHF) is utilized, thereby selectively removing the sacrificing layer 20. As a result, the vibrating portion 11 is supported to the substrate surface by the beam portions 12 and the supporting portions 13 through the gap G. Note that, at this time, the remaining insulating layer 17 other than the insulating layer 17 embedded between each adjacent p-Si layers 16 and 18 is also removed. By carrying out the processes described above, the MEMS resonator 1 shown in FIG. 1 is completed.

In the MEMS resonator 1 of the embodiment described above, only a signal having a certain specific frequency in an electric signal is converted into a mechanical vibration, and the mechanical vibration is converted into an electric signal again, whereby the MEMS resonator 1 functions as a resonator.

Specifically, firstly, when the input A.C. signal Sin having an arbitrary frequency is inputted from the input signal line Lin to each of the three input blocks of the conductor portion 111 through the corresponding ones of the supporting portions 13 and the corresponding ones of the beam portions 12, the electrostatic attractive force having the arbitrary frequency is generated in each of the five insulating films 112, and thus the compressive stress acts on the inside of the vibrating portion 11. That is to say, the electric signal is converted into the mechanical vibration.

Here, when the arbitrary frequency of the input A.C. signal Sin is equal to a resonance frequency fr, of the longitudinal wave vibration, depending on the size of the MEMS resonator 1, the vibrating portion 11 carries out the resonance vibration based on the longitudinal wave vibration. The resonance vibration based on the longitudinal wave vibration is represented in the form of the waveform W1 shown in FIG. 1.

Then, each of the five insulating films 112 repetitively carries out the compression and the expansion by the vibration. The potential difference due to an induced electromotive force is caused across the both end surfaces (the Y-Z end surfaces) of each of the five insulating films 112 by such a deformation (indicated by the two-headed arrow P1 in FIGS. 1 and 2) of each of the five insulating films 112. That is to say, the mechanical vibration is re-converted into the electric signal. As a result, the output A.C. signal Sout having the frequency equal to the resonance frequency fr is outputted from each of the three output blocks of the conductor portion 111 through the corresponding ones of the beam portions 12, and the corresponding ones of the supporting portions 13, and the output signal line Lout. The MEMS resonator 1 functions as a resonator for selectively transmitting only the signal having the certain frequency (the resonance frequency fr) of the arbitrary input A.C. signal Sin in accordance with such principles of the operation.

Figure 10:
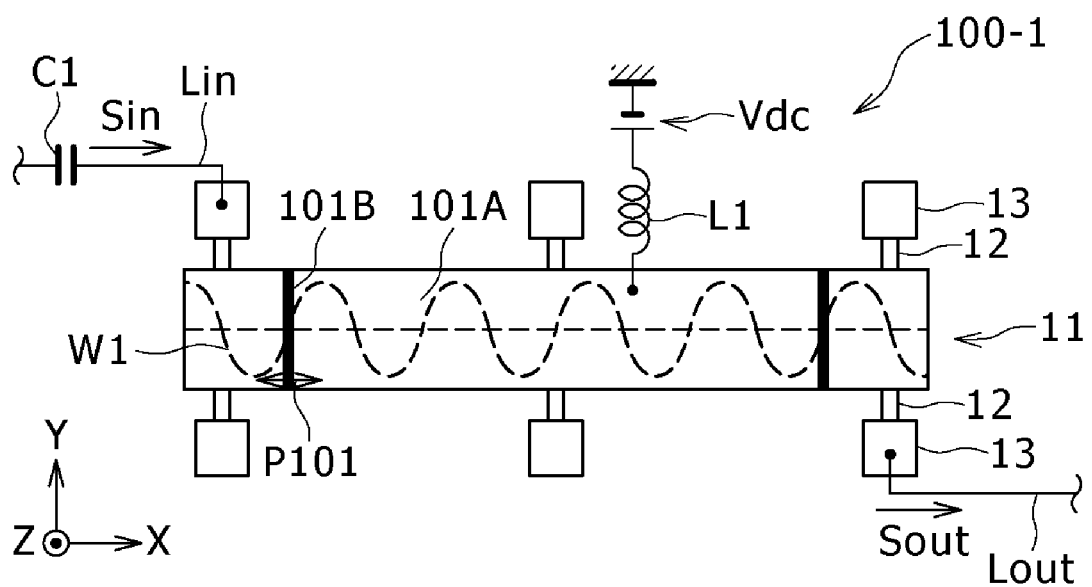
FIG. 10 is a top plan view schematically showing a construction and the principles of an operation of the existing resonator shown in FIG. 9.

Here, since in the MEMS resonator 1, the three or more insulating films (the five insulating films in this case) 112 are provided within the vibrating portion 11, an area (an area in the Y-Z end surface) of the insulating films 112 within the vibrating portion 11 becomes larger than that in the case of the existing MEMS resonator 100-1 (having the two insulating films 101B) shown in FIG. 10.

Now, the insulating film 112 can be thought like a parallel plate type capacitor in which a distance between opposite electrodes is displaced. Thus, it can be readily imagined that a driving force becomes large as the area of the insulating films 112 is larger. Therefore, considering about the dielectric embedded longitudinal wave vibration MEMS resonator like the MEMS resonator 1 of the embodiment, an impedance Rx of the MEMS resonator 1 is expressed by Expression (1):

$$R_x \propto \frac{\sqrt{Y\rho}}{S\varepsilon^2 V^2} \quad (1)$$

where S is a total sum of the areas of the five insulating films 112, Y is a Young's modulus of the vibrating portion 11 (the conductor portion 111), p is a density of the vibrating portion 11 (the conductor portion 111), ∈ is an electric permittivity of the insulating film 112, and V is a potential difference (corresponding to the D.C. voltage Vdc) caused across the both ends (the Y-Z end surfaces) of the insulating film 112.

Here, it is understood from Expression (1) that the impedance Rx of the MEMS resonator 1 becomes small as the area S as the total sum of the areas of the five insulating films 112 becomes larger (the impedance Rx is in inverse proportion to the total sum S of the areas of the five insulating films 112). Therefore, since in the MEMS resonator 1, the multiple insulating films 112 (the five insulating films 112 in this case) are provided within the vibrating portion 11 as compared with the case of the existing MEMS resonator 100-1, the impedance Rx of the MEMS resonator 1 is reduced as compared with the case of the existing MEMS resonator 100-1.

As has been described, in the embodiment, the three or more insulating films 112 are provided within the vibrating portion 11 for carrying out the resonance vibration based on the longitudinal wave vibration in accordance with the frequency of the input A.C. signal Sin. As a result, it is possible to increase the total sum (the area S) of the areas (the area of the Y-Z end surfaces) of the five insulating films 112 within the resonating portion 11, and thus it is possible to reduce the impedance Rx of the MEMS resonator 1 as compared with the case of the existing MEMS resonator 100-1.

In addition, the input A.C. signal Sin is inputted from the input signal line Lin to each of the three input blocks of the conductor portion 111 through the corresponding ones of the supporting portions 13, and the corresponding ones of the beam portions 12. As a result, it is unnecessary to specially provide the dedicated electrodes or the like for input of the input A.C. signal Sin, and thus it is possible to simplify the construction of the MEMS resonator 1.

In addition, the D.C. voltage Vdc is also supplied to each of the three input blocks (or each of the three output blocks) of the conductor portion 111. As a result, the number of insulating films 112 can be made larger than that in Change 1 which will be described later, and thus a resonance peak can be made large.

3. Changes

Next, Changes of the embodiment of the MEMS resonator 1 will be described. It is noted that the same constituent elements as those in the embodiment of the MEMS resonator 1 are designated with the same reference numerals, respectively, and a description thereof is suitably omitted here for the sake of simplicity. In addition, since a method of manufacturing the MEMS resonator of each of Changes is basically identical to the embodiment of the method of manufacturing the MEMS resonator 1 except that a mask pattern is merely different from that in the method of manufacturing the MEMS resonator 1, a description thereof is omitted here for the sake of simplicity.

(Change 1)

Figure 4:
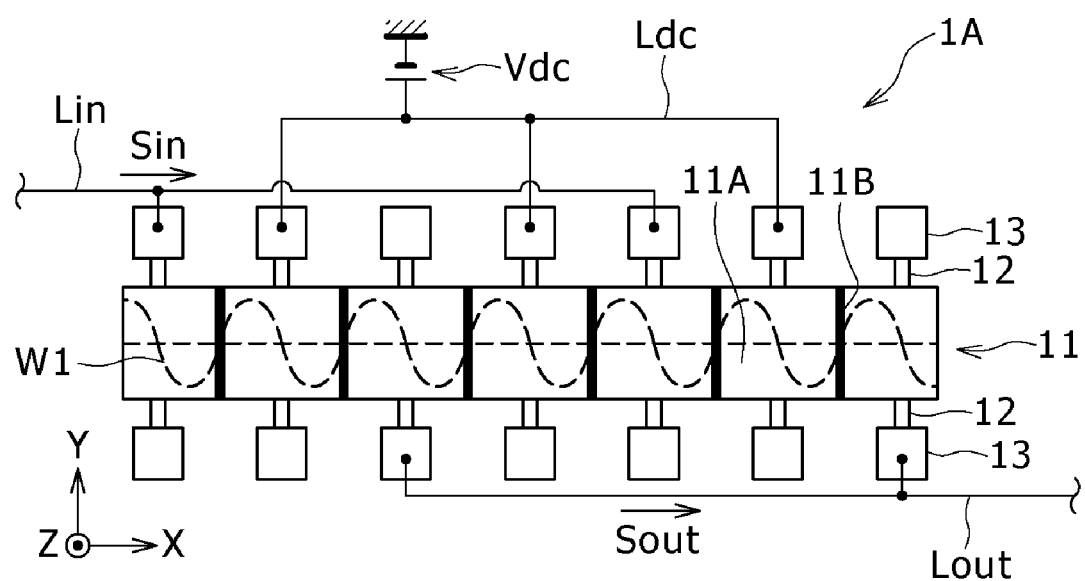
FIG. 4 is a top plan view schematically showing a construction and the principles of an operation of a resonator according to Change 1 of the embodiment of the resonator shown in FIGS. 1 and 2.

FIG. 4 schematically shows a construction when viewed from an upper surface (a construction when viewed from an X-Y plane) of an MEMS resonator 1A according to Change 1 of the embodiment of the present invention.

In the MEMS resonator 1A of Change 1, unlike the resonator 1 of the embodiment described above, a plurality of blocks in the conductor portion 111 consist of two input blocks to each of which the input A.C. signal Sin is inputted, two output blocks from each of which the output A.C. signal Sout is outputted, and three voltage supply blocks which will be described below. The D.C. voltage Vdc for giving the potential difference across the both end surfaces (the Y-Z end surfaces) in each of the insulating films 112 is supplied to each of the three voltage supply blocks through a voltage supply line Ldc, the corresponding ones of the beam portions 12 and the corresponding ones of the supporting portions 13. In addition, in the resonator 1A, the three voltage supply blocks are disposed so as to be woven with the two input blocks and the two output blocks along the transmission direction (along the X-axis directions) of the A.C. signal.

In Change 1, by adopting the construction described above, a parasitic capacitance between the input and the output becomes smaller than that in the MEMS resonator 1 of the embodiment. As a result, a background level of the resonance characteristics can be reduced, thereby increasing an S/N ratio of the A.C. signal.

(Change 2)

Figure 5A:
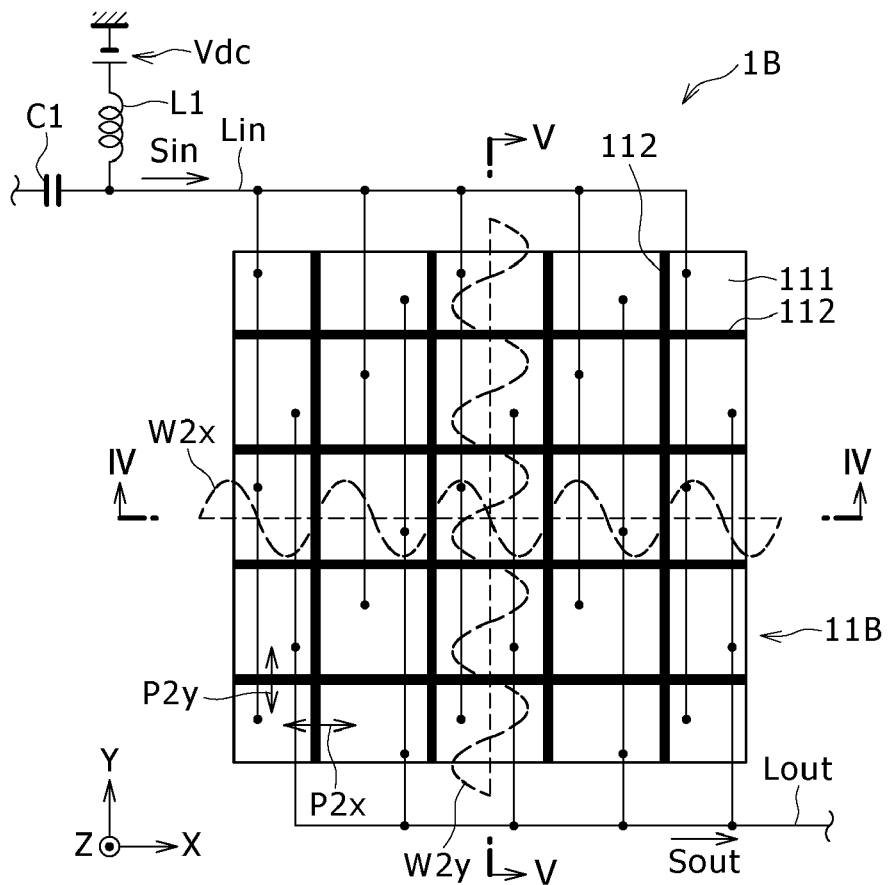
FIGS. 5A, 5B and 5C are respectively a top plan view schematically showing a construction and the principles of an operation of a resonator according to Change 2 of the embodiment of the resonator shown in FIGS. 1 and 2, a cross sectional view taken on line IV-IV of FIG. 5A, and a cross sectional view taken on line V-V of FIG. 5A.
Figure 5B:
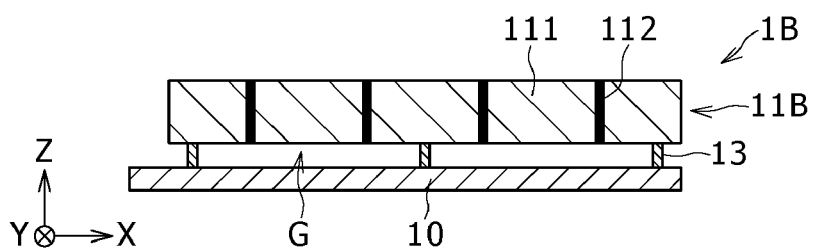
Figure 5C:
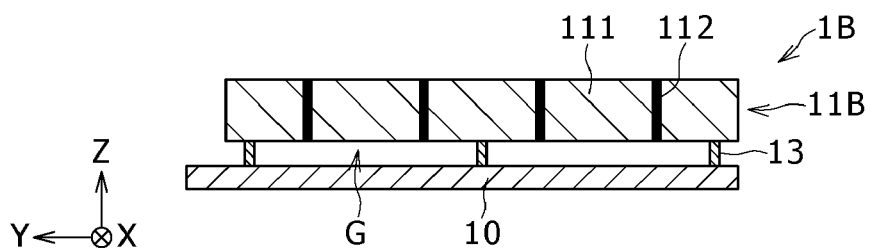

FIG. 5A schematically shows a construction when viewed from an upper surface (a construction when viewed from an X-Y plane) of an MEMS resonator 1B according to Change 2 of the embodiment of the present invention. In addition, FIG. 5B is a cross sectional view taken on line IV-IV of FIG. 5A, and FIG. 5C is a cross sectional view taken on line V-V of FIG. 5A.

In the MEMS resonator 1B of Change 2, a vibrating portion 11B has a rectangular parallelepiped-like shape in which an X-Y plane has a rectangular shape (a square shape in this case). Also, a plurality of insulating films 112 (16 insulating films 112 (=4×4) in this case) are embedded in a vibrating portion 11B so as to extend in the two directions (in the X-axis direction and the Y-axis direction) making at a right angle with each other within the vibrating surface (the X-Y plane). In this case, the four insulating films 112 extend along the X-axis direction, and the four insulating films 112 extend along the Y-axis direction. Thus, a plurality of blocks (25 blocks (=5×5) in this case) in the conductor portion 111 are disposed in a matrix within the vibrating surface. That is to say, a plurality of blocks in the conductor portion 111, and a plurality of insulating films 112 are disposed so that each of the insulating films 112 vibrates along the two directions (along the X-axis direction and the Y-axis direction) within the vibrating surface of the vibrating portion 11B (indicated by two-headed arrows P2x and P2y in FIG. 5A). In addition, in a plurality of blocks of the conductor portion 111, the input blocks to each of which the input A.C. signal Sin is inputted, and the output blocks from each of which the output A.C. signal is outputted are alternately disposed along the two directions (along the X-axis direction and the Y-axis direction) within the vibrating surface. Also, the D.C. voltage Vdc is supplied to each of ones of the input blocks and the output blocks (the input blocks in this case).

It is noted that in the MEMS resonator 1B as well, similarly to the case of the MEMS resonator 1 of the embodiment described above, the conductor portion 111 is separated into a plurality of blocks along the transmission directions (along the X-axis direction and the Y-axis direction) of the A.C. signal. In addition, each of the five insulating films 112, as shown in FIG. 5A, is preferably disposed either in a position corresponding to at least one of node portions of the waveforms W2x and W2y in the longitudinal wave vibration or in the vicinity of the at least one of node portions of the waveform W1 in the longitudinal wave vibration. In addition, similarly, each of the beam portion 12 and the supporting portion 13 is also preferably disposed in the position corresponding to at least one of node portions of the waveforms W2x and W2y in the longitudinal wave vibration or in the vicinity of the at least one of the node portions of the waveforms W2x and W2y in the longitudinal wave vibration.

In Change 2 as well, by adopting such a construction, the same effect as that in the embodiment described above can be obtained based on the same operation as that in the embodiment described above. That is to say, it is possible to increase the total sum (the area S) of the areas (the area of the Y-Z end surfaces or the Z-X end surfaces) of the sixteen insulating films 112 within the resonating portion 11B, and thus it is possible to reduce the impedance Rx of the MEMS resonator 1 as compared with the case of the existing MEMS resonator 100-1.

In addition, in Change 2, since the vibrations in the two directions (in the X-axis direction and the Y-axis direction) making at a right angle with each other within the vibrating surface (the X-Y plane) are utilized, the efficiency for the vibration area of the vibrating portion 11B is improved, and thus it is possible to increase the resonance peak.

(Change 3)

Figure 6A:
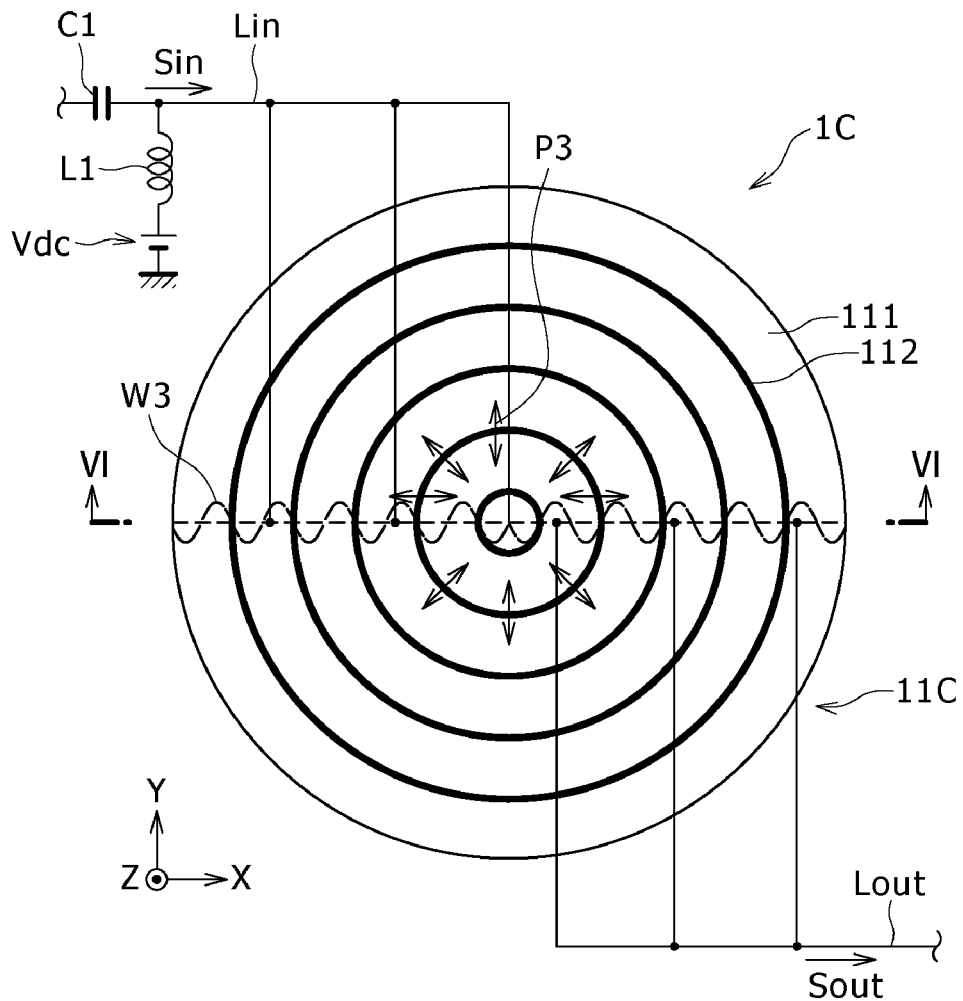
FIGS. 6A and 6B are respectively a top plan view schematically showing a construction and the principles of an operation of a resonator according to Change 3 of the embodiment of the resonator shown in FIGS. 1 and 2, and a cross sectional view taken on line VI-VI of FIG. 6A.
Figure 6B:
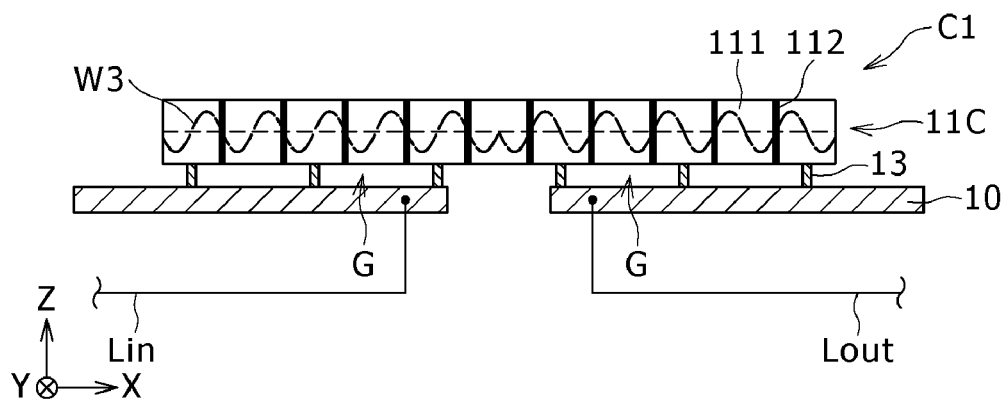

FIG. 6A schematically shows a construction when viewed from an upper surface (a construction when viewed from an X-Y plane) of a resonator 1C according to Change 3 of the embodiment of the present invention. In addition, FIG. 6B is a cross sectional view taken on line VI-VI of FIG. 6A.

In the resonance 1C of Change 3, a vibration portion 11C has a columnar shape in which an X-Y plane has a circular shape. Also, in the vibrating portion 11C, a plurality of insulating films 112 (the five insulating films 112 in this case) are embedded so as to be disposed concentrically within the vibrating surface (the X-Y plane). As a result, in the vibrating portion 11C, a plurality of blocks (the six blocks in this case) in the conductor portion 111 are similarly disposed concentrically within the vibrating surface. That is to say, a plurality of blocks in the conductor portion 111, and a plurality of insulating films 112 are disposed so that each of the insulating films 112 vibrates radially from a center of the concentric circle described above toward the outer periphery within the vibrating surface of the vibrating portion 11C (indicated by a two-headed arrow P3 in FIG. 6A). In addition, in a plurality of blocks in the conductor portion 111, the three input blocks to each of which the input A.C. signal Sin is inputted, and the three output blocks from each of which the output A.C. signal Sout is outputted are alternately disposed from the center of the concentric circle within the vibrating surface toward the outer periphery. Also, the D.C. voltage Vdc is supplied to each of ones of the three input blocks and the three output blocks (each of the three output blocks in this case).

It is noted that in the MEMS resonator 1C as well, similarly to the case of the MEMS resonator 1 of the embodiment described above, the conductor portion 111 is separated into a plurality of blocks along the transmission direction (in the radial direction described above) of the A.C. signal. In addition, each of the five insulating films 112, as shown in FIGS. 6A and 6B, is preferably disposed either in a position corresponding to at least one of node portions of the waveform W3 in the longitudinal wave vibration or in the vicinity of the at least one of the node portions of the waveform W3 in the longitudinal wave vibration. In addition, similarly, as shown in FIGS. 6A and 6B, each of the beam portion 12 and the supporting portion 13 is also preferably disposed in the position corresponding to the at least one of the node portions of the waveform W3 in the longitudinal wave vibration or in the vicinity of the at least one of the node portions of the waveform W3 in the longitudinal wave vibration.

In Change 3 as well, by adopting such a construction, the same effect as that in the embodiment described above can be obtained based on the same operation as that in the embodiment described above. That is to say, it is possible to increase the total sum (the area S) of the areas (the area of the Y-Z end surfaces or the Z-X end surfaces) of the five insulating films 112 within the resonating portion 11C, and thus it is possible to reduce the impedance Rx of the MEMS resonator 1C as compared with the case of the existing resonator 100-1.

In addition, in Change 3, in the vibrating portion 11C, each of the five insulating films 112, and each of the six blocks in the conductor portion 111 are continuously formed in the annular fashion along the direction making at a right angle with the vibration direction, and thus there is no end portion of the vibrating portion 11C. As a result, since there is no loss of the energy, and the change of the frequency caused by the influence of the end portion, it is possible to increase a Q value of the MEMS resonator 1C.

(Change 4)

Figure 7A:
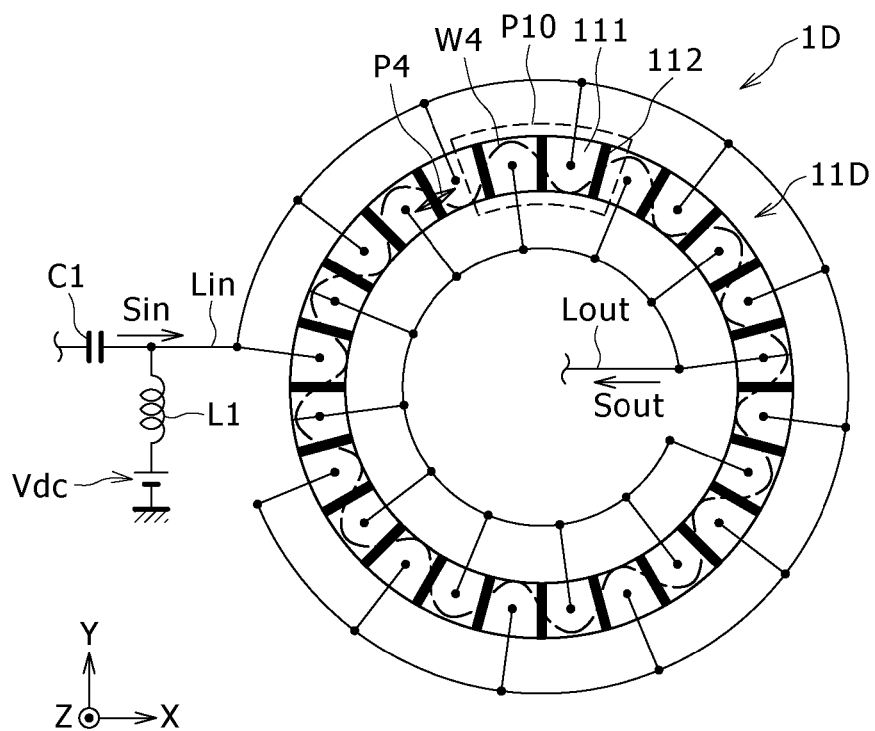
FIGS. 7A and 7B are respectively a top plan view schematically showing a construction and the principles of an operation of a resonator according to Change 4 of the embodiment of the resonator shown in FIGS. 1 and 2, and a partially enlarged view of a portion P10 of the resonator shown in FIG. 7A.
Figure 7B:
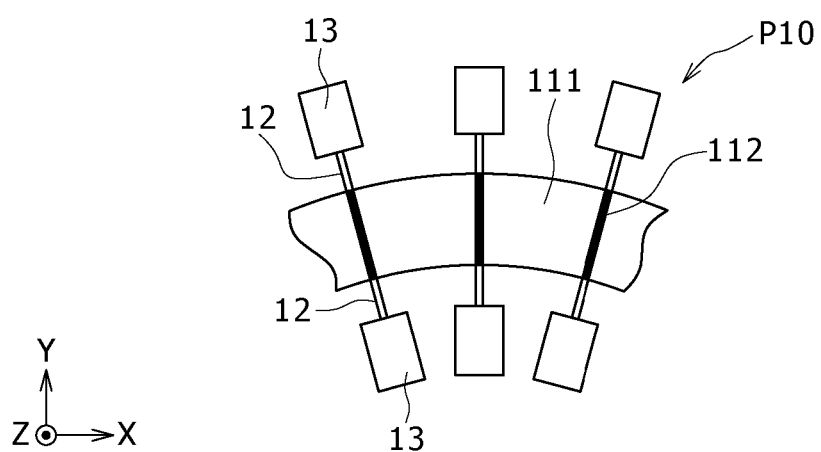

FIG. 7A schematically shows a construction when viewed from an upper surface (a construction when viewed from an X-Y plane) of an MEMS resonator 1D according to Change 4 of the embodiment of the present invention. Also, FIG. 7B shows an enlarged portion P10 in the MEMS resonator 1C shown in FIG. 7A in detail.

In the MEMS resonator 1D of Change 4, a vibrating portion 11D has a columnar shape which is annular within the vibrating surface (the X-Y plane). Also, in the vibrating portion 11D, a plurality of insulating films 112 (the twenty-four insulating films 112 in this case) are embedded so as to be disposed side by side around along the annular structure described above within the vibrating surface. As a result, in the vibrating portion 11D, a plurality of blocks (the twenty-four blocks in this case) in the conductor portion 111 are similarly disposed side by side around along the annular structure within the vibrating surface. That is to say, a plurality of blocks in the conductor portion 111, and a plurality of insulating films 112 are alternately disposed so that each of the insulating films 112 vibrates along the round direction in the annular structure within the vibrating surface of the vibrating portion 11D (indicated by a two-headed arrow P4 in FIG. 7A). In addition, in a plurality of blocks in the conductor portion 111, the input blocks to each of which the input A.C. signal Sin, and the output blocks from each of which the output A.C. signal Sout is outputted are alternately disposed along the round direction in the annular structure within the vibrating surface. Also, the D.C. voltage Vdc is supplied to each of ones of the input blocks and the output blocks (each of the input blocks in this case).

It is noted that in the MEMS resonator 1D as well, similarly to the case of the MEMS resonator 1 of the embodiment described above, the conductor portion 111 is separated into a plurality of blocks along the transmission direction (in the round direction described above) of the A.C. signal. In addition, each of the five insulating films 112, as shown in FIG. 7A, is preferably disposed either in a position corresponding to at least one of node portions of a waveform W4 in a longitudinal wave vibration or in the vicinity of the at least one of the node portions of the waveform W4 in the longitudinal wave vibration. In addition, similarly as shown in FIGS. 7A and 7B, each of the beam portion 12 and the supporting portion 13 is also preferably disposed in the position corresponding to the at least one of the node portions of the waveform W4 in the longitudinal wave vibration or in the vicinity of the at least one of the node portions of the waveform W4 in the longitudinal wave vibration.

In Change 4 as well, by adopting such a construction, the same effect as that in the embodiment described above can be obtained based on the same operation as that in the embodiment described above. That is to say, it is possible to increase the total sum (the area S) of the areas (the area of the Y-Z end surfaces or the Z-X end surfaces) of the twenty-four insulating films 112 within the resonating portion 11D, and thus it is possible to reduce the impedance Rx of the resonator 1D as compared with the case of the existing resonator 100-1.

In addition, in Change 4 as well, similarly to the case of Change 3 described above, in the vibrating portion 11D, the insulating films 112, and the blocks in the conductor portion 111 are continuously coupled to each other in the annular fashion along the direction making at a right angle with the vibration direction, and thus there is no end portion of the vibrating portion 11D. As a result, since there is no loss of the energy, and the change of the frequency caused by the influence of the end portion, it is possible to increase the Q value of the resonator 1D.

It should be noted that although in Change 4, the description has been given with respect to the case where the shape within the vibrating surface in the vibrating portion 11D is the annular shape, the shape within the vibrating surface in the vibrating portion 11D may also be a circular shape other than the annular shape.

4. Oscillator

The present invention can also be applied to an oscillator equipped with the MEMS resonator 1 of the embodiment shown in FIGS. 1 and 2.

An oscillator according to an embodiment of the present invention includes the MEMS resonator 1, of the embodiment shown in FIGS. 1 and 2, which carries out the resonance vibration. In this case, the MEMS resonator 1 includes the vibrating portion 11 having the conductor portion 111, and the five insulating films 112 provided so as to electrically separate the conductor portion 111 into the six blocks. Also, in this case, when the potential difference is caused across both ends in each of the five insulating films 112, the vibrating portion 11 carries out the resonance vibration based on the longitudinal vibration in accordance with the frequency of the input A.C. signal Sin inputted to each of corresponding ones of the six blocks in the conductor portion 111.

5. Electronic Apparatus

Figure 8:
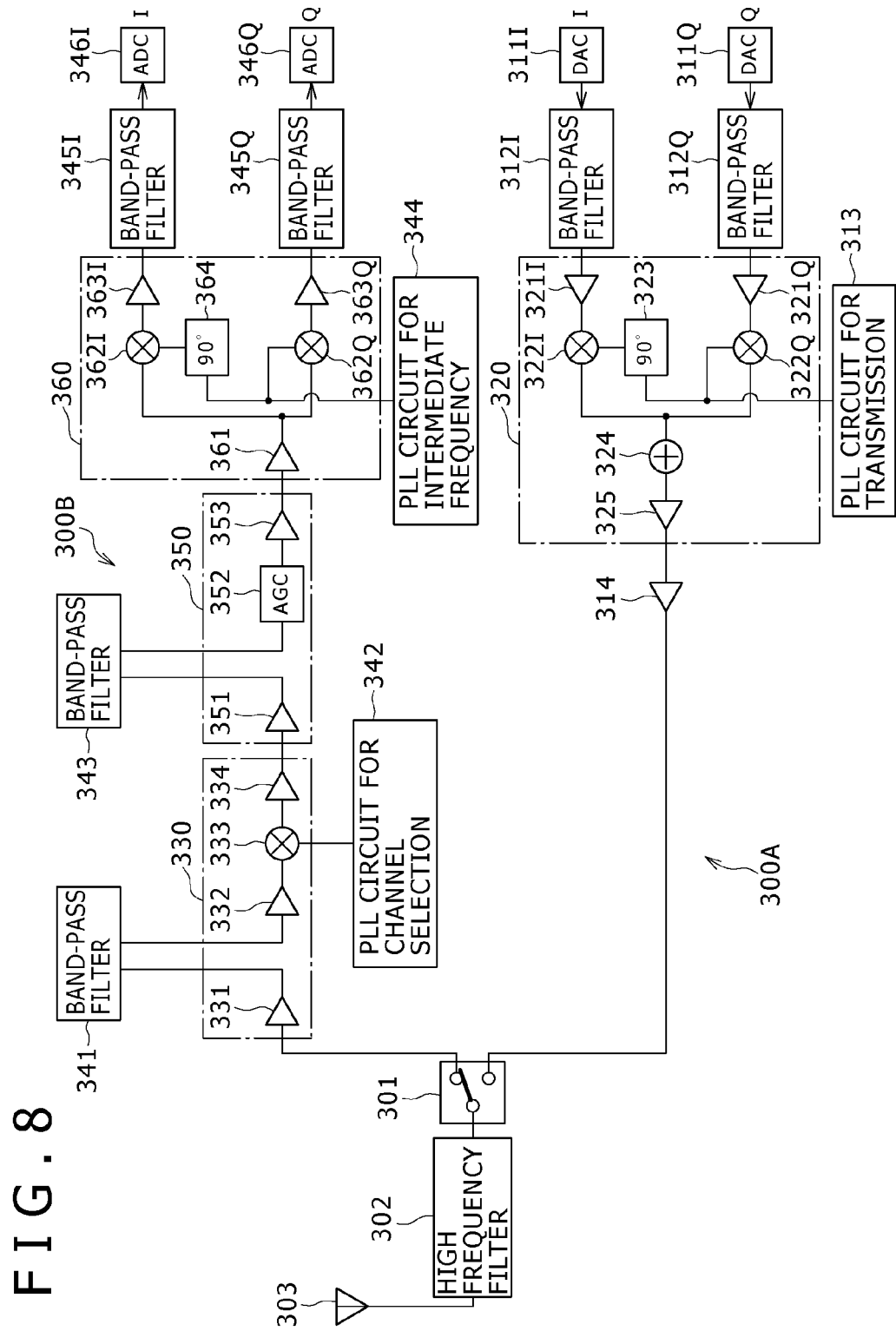
FIG. 8 is a functional block diagram showing a configuration of an embodiment of a communication apparatus as an electronic apparatus equipped with the resonator shown in FIGS. 1 and 2.
Figure 9:
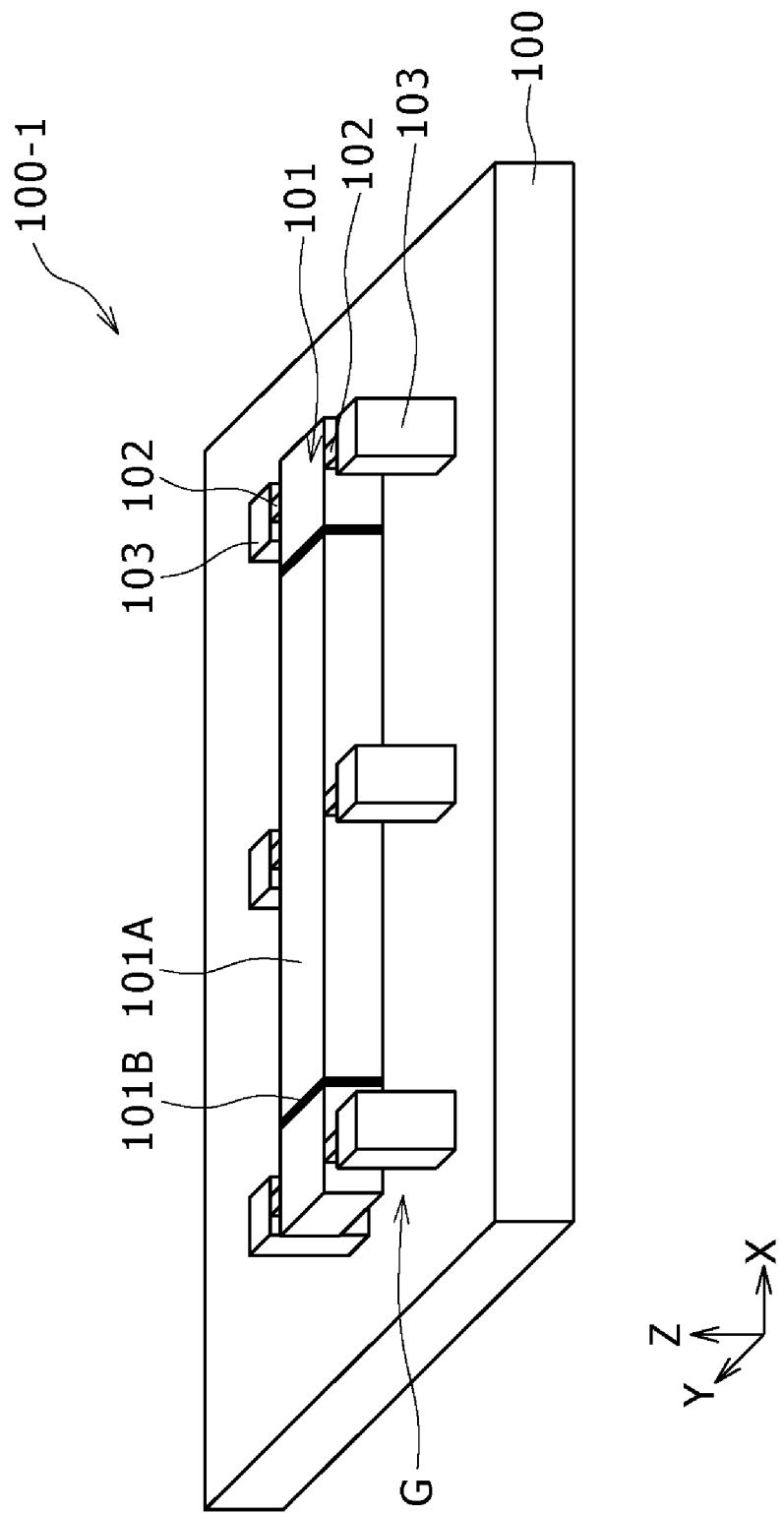
FIG. 9 is a perspective view showing an example of an exterior appearance of an existing resonator.

FIG. 8 is a functional block diagram showing a configuration of a communication apparatus as an electronic apparatus, equipped with the resonator 1 described in the embodiment, according to an embodiment of the present invention. The communication apparatus is equipped with the resonator 1 described in the embodiment in an oscillator in a PLL (Phase-Locked Loop) circuit 313 for transmission, a PLL circuit 342 for channel selection, a PLL circuit 344 for an intermediate frequency, or the like, or in a filter element in a high-frequency filter 302 or the like. Here, the PLL circuit 313 for transmission, the PLL circuit 342 for channel selection, the PLL circuit 344 for an intermediate frequency, and the high-frequency filter 302 will be described later. Specifically, the communication apparatus, for example, is a mobile terminal, personal digital assistants (PDA), a wireless LAN apparatus, or the like.

The communication apparatus, for example, includes a transmission system circuit 300A, a reception system circuit 300B, a transmission/reception switching unit 301 for switching a transmission path and a reception path over each other, the high-frequency filter 302, and an antenna 303 for transmission/reception.

The transmission system circuit 300A includes two Digital/Analog Converters (DACs) 311I and 311Q, and two band-pass filters 312I and 312Q. The DAC 311I and the band-pass filter 312I, and the DAC 311Q and the band-pass filter 312Q are provided so as to correspond to transmission data of an I-channel, and transmission data of a Q-channel, respectively. The transmission system circuit 300A also includes a modulator 320, a PLL circuit 313 for transmission, and a power amplifier 314. The modulator 320 includes a buffer amplifier 321I and a mixer 322I, and a buffer amplifier 321Q and a mixer 322Q which are provided so as to correspond to the two band-pass filters 312I and 312Q described above, respectively, a phase shifter 323, an adder 324, and a buffer amplifier 325.

The reception system circuit 300B includes a high-frequency portion 330, a band-pass filter 341, the PLL circuit 342 for channel selection, an intermediate-frequency circuit 350, a band-pass filter 343, a demodulator 360, and the PLL circuit 344 for an intermediate frequency. The reception system circuit 300B also includes a band-pass filter 345I and an Analog/Digital Converter (ADC) 346I, and a band-pass filter 345Q and an ADC 346Q which are provided so as to correspond to the transmission data of the I-channel, and the transmission data of the Q-channel, respectively. The high-frequency portion 330 includes a low-noise amplifier 331, buffer amplifiers 332 and 334, and a mixer 333. The intermediate-frequency circuit 350 includes buffer amplifiers 351 and 353, and an Auto Gain Controller (AGC) circuit 352. The demodulator 360 includes a buffer mixer 361, a mixer 362I and a buffer amplifier 363I, and a mixer 362Q and a buffer amplifier 363Q which are provided so as to correspond to the two band-pass filters 345I and 345Q described, respectively, and a phase shifter 364.

When the transmission data of the I-channel, and the transmission data of the Q-channel are both inputted to the transmission system circuit 300A, the communication apparatus processes the transmission data of the I-channel, and the transmission data of the Q-channel in the following procedure. That is to say, firstly, the transmission data of the I-channel, and the transmission data of the Q-channel are converted into analog signals in the DACs 311I and 311Q, respectively. Subsequently, signal components having band widths other than band widths of the analog signals are removed in the band-pass filters 312I and 312Q, respectively. After that, the resulting analog signals are supplied to the modulator 320. Subsequently, the resulting analog signals are supplied to the mixers 322I and 322Q through the buffer amplifiers 321I and 321Q, respectively, and are subsequently mixed with frequency signals, each corresponding to the transmission frequency, supplied from the PLL circuit 313 for transmission to be modulated. After that, both the resulting mixture signals are added to each other in the adder 324, thereby obtaining an I system transmission signal. In this case, the frequency signal which is intended to be supplied to the mixer 322I is shifted in phase thereof by 90° in the phase shifter 323, so that the analog signal of the I-channel, and the analog signal of the Q-channel are mutually subjected to the orthogonal modulation. Finally, the I system transmission signal is supplied to the power amplifier 314 through the buffer amplifier 325 to be amplified so as to obtain an analog signal having a predetermined transmission power. The resulting analog signal obtained through the amplification in the power amplifier 314 is supplied to the antenna 303 through both the transmission/reception switching unit 301 and the high-frequency filter 302 to be transmitted in a wireless manner through the antenna 303. The high-frequency filter 302 functions as a band-pass filter for removing a signal component(s) having a frequency band(s) other than a frequency band of a signal which is either transmitted or received in the communication apparatus.

On the other hand, when an analog signal is received at the reception system circuit 300B from the antenna 303, both the high-frequency filter 302 and the transmission/reception switching unit 301, the analog signal thus received is processed in accordance with the following procedure. That is to say, firstly, in the high-frequency portion 330, the received analog signal is amplified by the low-noise amplifier 331, and subsequently, signal components having the frequency bands other than the received frequency band of the received analog signal thus amplified are removed by the band-pass filter 341. After that, the resulting analog signal is supplied to the mixer 333 through the buffer amplifier 332. Subsequently, the resulting analog signal is mixed with a frequency signal supplied from the PLL circuit 342 for channel selection by the mixer 333, so that the signal of a predetermined transmission channel is made to turn into an intermediate-frequency signal which is in turn supplied to the intermediate-frequency circuit 350 through the buffer amplifier 334. Subsequently, in the intermediate-frequency circuit 350, the intermediate-frequency signal is supplied to the band-pass filter 343 through the buffer amplifier 351, thereby removing signal components having the frequency band other than the frequency band of the intermediate-frequency signal. Also, subsequently, after the resulting analog signal is made to turn into the analog signal having approximately a constant gain in the AGC circuit 352, the analog signal having approximately the constant gain is supplied to the demodulator 360 through the buffer amplifier 353. Subsequently, in the demodulator 360, the analog signal having approximately the constant gain is supplied to each of the mixers 362I and 362Q through the buffer amplifier 361, and the two the analog signals each having approximately the constant gain are then mixed with frequency signals supplied from the PLL circuit 344 for an intermediate frequency, respectively, thereby modulating the analog signal component of the I-channel, and the analog signal component of the Q-channel. In this case, the frequency signal which is intended to be supplied to the mixer 362I is shifted in phase thereof by 90° in the phase shifter 364, so that the analog signal of the I-channel, and the analog signal of the Q-channel are mutually subjected to the orthogonal modulation. Finally, after the analog signal of the I-channel, and the analog signal of the Q-channel are supplied to the band-pass filters 345I and 345Q, respectively, thereby removing signal components other than the analog signal of the I-channel, and the analog signal of the Q-channel, the analog signal of the I-channel, and the analog signal of the Q-channel are supplied to the ADC 346I and ADC 346Q to be converted into the digital data of the I-channel, and the digital data of the Q-channel, respectively. As a result, the received data of the I-channel, and the received data of the Q-channel are both obtained.

The communication apparatus is equipped with the MEMS resonator 1 described in the embodiment in the oscillator in the PLL circuit 313 for transmission, the PLL circuit 342 for channel selection, the PLL circuit 344 for the intermediate frequency, or the like, or in the filter element in the high-frequency filter 302 or the like. Therefore, the communication apparatus has the excellent high-frequency characteristics based on the operation described in the embodiment of the MEMS resonator 1 or the like.

Although the present invention has been described so far by giving the embodiments and Changes 1 to 4, the present invention is by no means limited thereto, and thus the various kinds of changes can be made.

For example, the materials and the thickness, or the deposition methods and the deposition conditions of the individual layers described in the embodiments or the like are not limited. Thus, other materials and thicknesses may also be adopted or other deposition methods and deposition conditions may also be adopted in the present invention.

In addition, although in the embodiments described above, the description has been given with respect to the case where the resonator of the present invention is supplied to the oscillator, and the electronic apparatus typified by the communication apparatus, the resonator of the present invention is by no means limited thereto. That is to say, for example, the resonator of the present invention can also be applied to an electronic apparatus (such as a measuring instrument) other than the communication apparatus of the present invention. In any of these cases, it is possible to obtain the same effects as those in the embodiments or the like described above.

The present application contains subject matter related to that disclosed in Japanese Priority Patent Application JP 2009-146650 filed in the Japan Patent Office on Jun. 19, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A resonator comprising:
    a vibrating portion having a conductor portion; and
    three or more insulating portions embedded in the conductor portion so as to electrically separate the conductor portion into a plurality of blocks;
    wherein when a potential difference is caused across both ends in each of said three or more insulating portions, said vibrating portion carries out a resonance vibration based on a longitudinal vibration in accordance with a frequency of an A.C. signal inputted to each of corresponding ones of said plurality of blocks in said conductor portion.

2. The resonator according to claim 1, further comprising a supporting portion for supporting said vibrating portion to one surface of a substrate through a gap.

3. The resonator according to claim 1, wherein the A.C. signal is inputted through a supporting portion.

4. The resonator according to claim 2, wherein said supporting portion is disposed either in a position corresponding to at least one of node portions in the longitudinal wave vibration, or in a vicinity of the position.

5. The resonator according to claim 1, wherein each of said three or more insulating portions is disposed either in a position corresponding to at least one of node portions in the longitudinal wave vibration, or in a vicinity of the position.

6. The resonator according to claim 1, wherein said conductor portion is separated into said plurality of blocks along a transmission direction of the A.C. signal.

7. The resonator according to claim 1, wherein said plurality of blocks in said conductor portion is composed of an input block to which an A.C. signal is inputted, and an output block from which an A.C. signal is outputted; and a D.C. voltage for causing the potential difference is supplied to one of said input block and said output block.

8. The resonator according to claim 7, wherein the input blocks and the output blocks are alternately disposed along a transmission direction of the A.C. signal.

9. The resonator according to claim 1, wherein said plurality of blocks in said conductor portion is composed of an input block to which an A.C. signal is inputted, an output block from which an A.C. signal is outputted, and a voltage supply block to which a D.C. voltage for causing the potential difference is supplied.

10. The resonator according to claim 9, wherein said voltage supply block is disposed between said input block to which the A.C. signal is inputted, and said output block from which the A.C. signal is outputted along a transmission direction of the A.C. signal.

11. The resonator according to claim 1, wherein said plurality of blocks in said vibrating portion, and said three or more insulating portions are disposed along predetermined one direction so that in said vibrating portion, each of said three or more insulating portions vibrates in the predetermined one direction.

12. The resonator according to claim 1, wherein said plurality of blocks in said vibrating portion, and said three or more insulating portions are disposed so that each of said three or more insulating portions vibrates along two directions making at a right angle with each other within a vibrating surface of said vibrating portion.

13. The resonator according to claim 12, wherein said three or more insulating portions extend along the two directions within said vibrating surface by plural ones; and said plurality of blocks in said conductor portion are disposed in a matrix within said vibrating surface.

14. The resonator according to claim 1, wherein in said plurality of blocks in said conductor portion, input blocks to each of which an A.C. signal is inputted, and output blocks from each of which an A.C. signal is outputted are alternately disposed along the two directions within said vibrating surface.

15. The resonator according to claim 1, wherein said three or more insulating portions are disposed concentrically within a vibrating surface of said vibrating portion; and said three or more insulating portions vibrate radially from a center of a concentric circle toward an outer periphery within said three or more insulating portions.

16. The resonator according to claim 1, wherein said vibrating portion is constructed in an annular fashion within a vibrating surface; and said three or more insulating portions are disposed side by side around along the annular structure, and vibrate along a round direction.

17. A method of manufacturing a resonator, comprising the step of forming a vibrating portion having a conductor portion, and three or more insulating portions embedded in the conductor portion for electrically separating said conductor portion into a plurality of blocks, and carrying out a resonance vibration based on a longitudinal vibration in accordance with a frequency of an A.C. signal inputted to each of corresponding ones of said plurality of blocks in said conductor portion when a potential difference is caused across both ends in each of said three or more insulating portions on a substrate.

18. The method of manufacturing a resonator according to claim 17, wherein the step of forming said vibrating portion comprises the steps of: forming a conductor pattern layer having a plurality of conductor patterns disposed separately from one another on said substrate; forming an insulating layer on a surface and a side surface of said conductor pattern layer; forming a conductor layer on said insulating layer; and planarizing surfaces of said conductor pattern layer, said insulating layer and said conductor layer, thereby forming said conductor portion and said three or more insulating portion.

19. An oscillator, comprising:
a resonator for carrying out a resonance vibration;
said resonator including, a vibrating portion having a conductor portion, and three or more insulating portions embedded in the conductor portion so as to electrically separate said conductor portion into a plurality of blocks;
wherein when a potential difference is caused across both ends in each of said three or more insulating portions, said vibrating portion carries out a resonance vibration based on a longitudinal vibration in accordance with a frequency of an A.C. signal inputted to each of corresponding ones of said plurality of blocks in said conductor portion.

20. An electronic apparatus, comprising:
a resonator for carrying out a resonance vibration;
said resonator including, a vibrating portion having a conductor portion, and three or more insulating portions embedded in the conductor portion so as to electrically separate said conductor portion into a plurality of blocks;
wherein when a potential difference is caused across both ends in each of said three or more insulating portions, said vibrating portion carries out a resonance vibration based on a longitudinal vibration in accordance with a frequency of an A.C. signal inputted to each of corresponding ones of said plurality of blocks in said conductor portion.

* * * * *